(12) United States Patent
Choi (10) Patent No.: US 7,928,504 B2
(45) Date of Patent: Apr. 19, 2011

(54) SEMICONDUCTOR MEMORY DEVICE AND METHOD FOR MANUFACTURING THE SAME

(75) Inventor: Woong Choi, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 12/494,243

(22) Filed: Jun. 29, 2009

(65) Prior Publication Data

US 2010/0270602 A1    Oct. 28, 2010

(30) Foreign Application Priority Data

Apr. 24, 2009  (KR) .................. 10-2009-0036063

(51) Int. Cl.
- H01L 29/788 (2006.01)
- H01L 29/76 (2006.01)
- H01L 21/336 (2006.01)
- H01L 21/3205 (2006.01)

(52) U.S. Cl. . 257/326; 257/330; 257/396; 257/E21.656; 257/E21.659; 438/259; 438/266; 438/270; 438/589

(58) Field of Classification Search .......... 438/259, 438/266, 270, 272, 589, 592; 257/296, 326, 257/330, 396, E21.656, E21.659
See application file for complete search history.

(56) References Cited

U.S. PATENT DOCUMENTS 7,595,262 B2 * 9/2009 Schlosser .................. 438/585

* cited by examiner

Primary Examiner — Hsien-ming Lee (57) ABSTRACT

A semiconductor memory device and a method for manufacturing the same are disclosed, which reduce parasitic capacitance generated between a storage node contact and a bit line of a high-integration semiconductor device. A method for manufacturing a semiconductor memory device includes forming a buried word line in an active region of a cell region, forming an insulation layer in the cell region and a lower electrode layer of a gate in a peripheral region so that a height of the insulation layer is substantially equal to that of the lower electrode layer, and providing a first conductive layer over the cell region and the peripheral region to form a bit line layer and an upper electrode layer.

19 Claims, 11 Drawing Sheets

<CELL REGION>   <PERIPHERAL REGION>

Fig.2c

<CELL REGION>   <PERIPHERAL REGION>

Fig.2d

<CELL REGION>   <PERIPHERAL REGION>

Fig.2e

<CELL REGION>   <PERIPHERAL REGION>

SEMICONDUCTOR MEMORY DEVICE AND METHOD FOR MANUFACTURING THE SAME

CROSS-REFERENCE TO RELATED APPLICATION

The priority of Korean patent application No. 10-2009-0036063 filed on Apr. 24, 2009, the disclosure of which is hereby incorporated in its entirety by reference, is claimed.

BACKGROUND OF THE INVENTION

The present invention relates to a semiconductor device, and more particularly to a semiconductor device and a method for manufacturing the same, which reduces parasitic capacitance of a bit line when forming a cell array contained in a high-integration semiconductor memory device.

Semiconductor devices are formed by implanting impurities or depositing a new material at a predetermined region in a silicon wafer. A representative example of the semiconductor devices may be a semiconductor memory device. The semiconductor memory device includes a large number of elements, for example, transistors, capacitors, resistors, and the like. Individual elements are interconnected through a conductive layer so that data or signals are communicated therebetween.

With the increasing development in technologies for manufacturing semiconductor devices, many people are conducting intensive research into a method for forming many more chips on one wafer by increasing the degree of integration of semiconductor devices. In order to increase the degree of integration, a minimum line width required for the design rules is made smaller. In addition, there is a need for semiconductor devices to be operated at a higher speed and reduced power consumption.

In order to increase the degree of integration of a semiconductor device, the size of each constituent element contained in the semiconductor device should be reduced and the length and width of connection wires should also be reduced. A representative example of the wiring used for a semiconductor memory device may be a word line for transferring a control signal or a bit line for transferring data. When reducing the cross-section of the word line or the bit line, resistance increases. The increase in resistance deteriorates a data transfer rate, increases the amount of power consumption, and finally results in a reduction in operational stability of the semiconductor memory device.

On the other hand, if the cross-sectional size of a word line or bit line is maintained as in the related art, when the degree of integration increases, a physical distance between a word line and a bit line is unavoidably reduced. This increases the parasitic capacitance. Compared with the bit line, the word line, used for transferring a control signal, has a relatively high potential. The bit line, used for transferring data received from a unit cell capacitor, may not operate normally due to the increase in parasitic capacitance and the high potential of the word line. If data is not smoothly and normally transferred through the bit line, a sense amplifier used to detect and amplify data may not detect the data. This results in a reading error.

In order to solve the problems caused by the increase of parasitic capacitance of the bit line, a method for increasing the amount of electric charges contained in the unit cell of a semiconductor memory device may be used. However, in order to implement the aforementioned method, a capacitor contained in the unit cell of the semiconductor memory device should be increased in size. However, the higher the degree of integration, the smaller the region occupied by the capacitor contained in the semiconductor memory device. That is, there is a limitation in increasing the size of a capacitor contained in the unit cell while increasing the degree of integration of the semiconductor memory device.

Figure 1A:
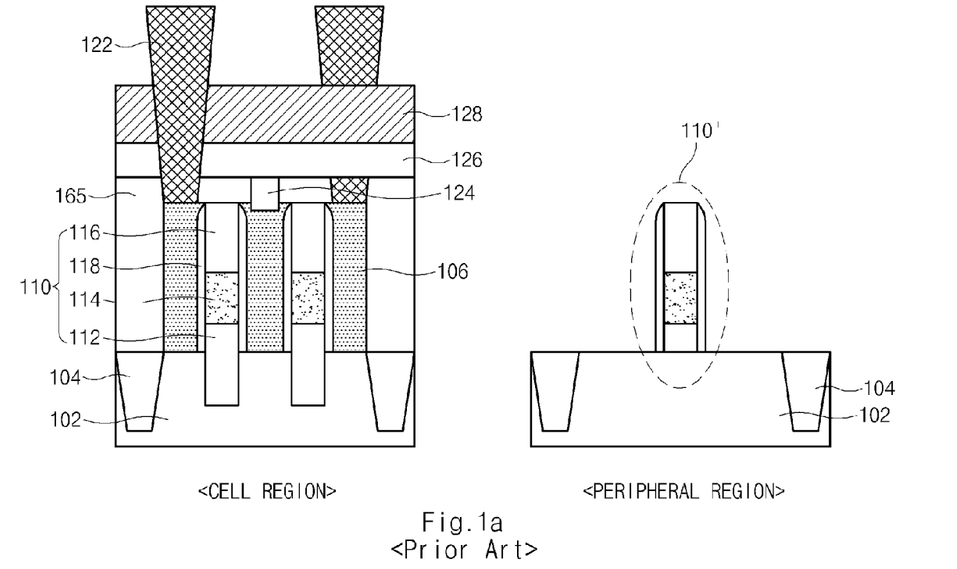
FIGS. 1a to 1c are conceptual diagrams illustrating cell regions and problems of a conventional semiconductor memory device.
Figure 1B:
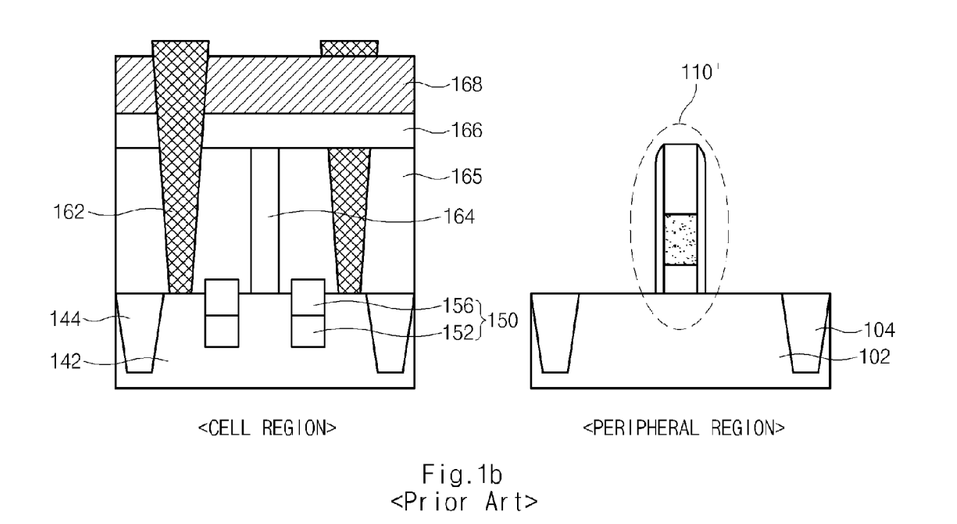
Figure 1C:
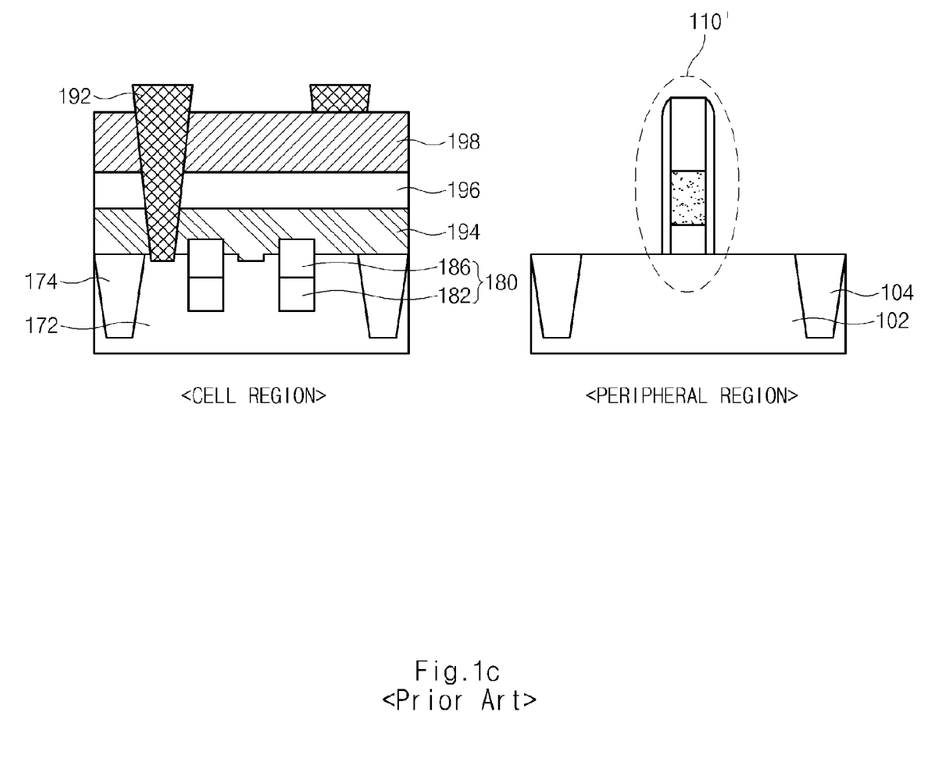

FIGS. 1a to 1c are conceptual diagrams illustrating cell regions and problems of with a conventional semiconductor memory device. FIG. 1a, 1b, or 1c illustrates a $6F^2$-sized unit cell contained in a semiconductor memory device. FIG. 1a illustrates a semiconductor memory device that includes a recess gate in a cell region. FIGS. 1b to 1c illustrate a semiconductor memory device including a buried gate in a cell region. In the meantime, a conventional gate pattern a planar channel region is formed in a peripheral region of the conventional semiconductor memory device illustrated in FIGS. 1a to 1c.

Referring to FIG. 1a, a cell region of the semiconductor memory device includes a gate pattern 110 in an active region 102, wherein the gate pattern 110 includes a lower gate electrode 112, an upper gate electrode 114, a gate hard mask layer 116, and a gate spacer 118. After forming a recess in the cell region, a conductive material is deposited on both the cell region and the peripheral region, so that the gate pattern 110 of the cell region and another gate pattern 110' of the peripheral region are simultaneously formed.

An insulation layer 165 formed on the active region 102 is etched at both sides of the gate pattern 110, so that a contact plug 106 is formed. In this case, the contact plug 106 is connected to a storage node contact 122 connected to a capacitor (not shown) and a bit line contact plug 124 connected to a bit line 126. A bit-line hard mask layer 128 is formed on the bit line 126. The storage node contact 122, the bit line 126, and the bit line contact plug 124 are electrically insulated by an insulation layer (not shown).

Referring to a structure of the cell region illustrated in FIG. 1a, although the above electrical insulation is implemented with the insulation layer, parasitic capacitance occurs in an overlapping region between the bit line 126 and the storage node contact 122. In addition, parasitic capacitance may also occur between the contact plug 106 connected to the bit line contact plug 124 and the gate pattern 110. In other words, as can be seen from the cell region illustrated in FIG. 1a, electric charges having different characteristics may be transferred to or be stored in a neighboring conductive region. The higher the degree of integration of the semiconductor memory device, the shorter a physical distance between neighboring conductive regions, resulting in the increase of parasitic capacitance. In order to solve this problem, a semiconductor device, including a buried gate, has been recently proposed. In the buried gate, the top of the gate pattern is formed below the surface of the active region.

Referring to FIG. 1b, a semiconductor memory device includes a gate pattern 150 composed of a gate electrode 152 and a gate hard mask layer 156 in an active region 142. In this case, since one gate pattern of the cell region and another gate pattern of the peripheral region are different in structure and height, an insulation layer is etched by a cell open mask or a cell close mask (i.e., a mask that covers the entire peripheral region and open to the entire cell region and vice versa), so that one gate pattern 110 of the cell region and the other gate pattern 110' of the peripheral region are formed.

Since the gate pattern 150 is buried in the active region, the contact plug 106 formed on the active region 142 illustrated in FIG. 1a is not required for the semiconductor memory device in FIG. 1b. However, the storage node contact 162, the bit line 166, and the bit line contact plug 164 are electrically insulated by the insulation layer 165. Also, the storage node contact 162 and the bit line contact plug 164 are formed after the gate pattern 110' of the peripheral region is formed in the same manner as in FIG. 1a. The insulation layer 165 is deposited in the cell region before the gate pattern 110' of the peripheral region is formed, so that the gate pattern 150 located under the insulation layer 165 is protected. In the cell region before the gate pattern 110' of the peripheral region is formed, the insulation layer 165 is etched so that an upper part of the active region 142 is exposed. The storage node contact 162 and the bit line contact plug 163 are directly connected to an upper part of the exposed active region 142. The bit line 166 and the bit line hard mask layer 168 are formed on the bit line contact plug 164.

The contact plug is not required for the semiconductor memory device illustrated in FIG. 1b, so that parasitic capacitance causing the problem in FIG. 1a is not generated in FIG. 1b. However, since a thickness of the insulation 165 is not reduced, it is difficult to secure a process margin for forming the storage node contact 162 and the bit line contact plug 164.

In more detail, the insulation layer 165 is deposited with a large thickness and then etched to expose the surface of an upper part of the active region 142. Finally, a conductive material is filled into the recess so that the storage node contact 162 and the bit line contact plug 164 are formed. However, it is difficult to expose the surface of an upper part of the active region 142 by etching the thickly-deposited insulation layer due to the reduction in the design rules. If a conductive material is filled into a recess where the active region 142 is not completely exposed, junction resistance increases among the storage node contact 162, the bit line contact plug 164, and a source/drain region contained in the active region 142. This may cause a malfunction to occur in the semiconductor memory device. Due to this problem, it is difficult to form each of the storage node contacts 162 and the bit line contact plug 164 to a sufficient depth to reduce the parasitic capacitance.

Referring to FIG. 1c, a semiconductor memory device includes a gate pattern 180 in an active region 172, where the gate pattern 180 includes a gate electrode 182 and a hard mask layer 186. Although the semiconductor memory device of FIG. 1c is similar to that of FIG. 1b in light of the presence of a buried gate structure, the insulation layer 165 is removed to form a storage node contact 192 and a bit line contact plug 194 so that the distance between a bit line 196 and the active region 172 is reduced. A pad nitride layer (not shown) is formed between the bit line 196 and the active region 172. Particularly, the insulation layer is completely etched using a cell open mask or a cell close mask, so that the gate pattern 180 of the cell region and the gate pattern 110' of the peripheral region are formed.

In more detail, if the bit line contact plug 194 connected to the active region 172 of the cell region and the bit line 196 are simultaneously formed using the same material as that of a gate electrode of the gate pattern formed in the peripheral region, each of the bit line contact plug 194, the bit line 196, and the bit line hard mask layer 198 may be formed to have the same or less height than the gate pattern of FIG. 1a. Through the above-mentioned processes, the height for forming the bit line 196 is reduced, so that the semiconductor memory device of FIG. 1c has no difficulty in forming the storage node contact 192 and the bit line contact plug 194, differently from the semiconductor memory device of FIG. 1b.

A semiconductor memory device illustrated in FIG. 1c has an advantage in that a storage node contact 192 and a bit line contact plug 194 can be easily formed, however, parasitic capacitance unavoidably increases in the same manner as in FIG. 1a. The reason why the parasitic capacitance increases is that a neighboring region among the bit line contact plug 194, the bit line 196, and the storage node contact 192 becomes larger, and the distance between the bit line contact plug 194 and the gate pattern 180 becomes shorter.

As described above, the higher the degree of integration of the semiconductor memory device, the higher the parasitic capacitance. In the meantime, a unit cell structure for restricting the occurrence of parasitic capacitance does not have a sufficient process margin for forming the storage node contact or the bit line contact plug, so that the possibility of generating an unexpected defective part in the unit cell structure increases.

BRIEF SUMMARY OF THE INVENTION

Various embodiments of the present invention are directed to providing a semiconductor memory device and a method for manufacturing the same that substantially obviate one or more problems due to limitations and disadvantages of the related art. When forming a cell array of a high-integration semiconductor device, various embodiments of the present invention provide a semiconductor memory device capable of increasing the operational stability by reducing parasitic capacitance by means of a fabrication method which implements a buried gate structure and guarantees a process margin for forming a storage node contact and a bit line contact plug.

In accordance with an aspect of the present invention, a method for manufacturing a semiconductor memory device comprises forming a buried word line in an active region of a cell region, forming an insulation layer in the cell region and a lower electrode layer of a gate in a peripheral region so that a height of the insulation layer is substantially equal to that of the lower electrode layer, and providing a first conductive layer over the cell region and the peripheral region to form a bit line layer and an upper electrode layer.

Preferably, method further comprises etching the insulation layer to form a bit line contact hole in the active region of the cell region, the bit line contact hole exposing the active region adjacent to the buried word line; and filling the bit line contact hole to form a bit line contact plug.

Preferably, the first conductive layer is formed by extending outside of the bit line contact hole to define the bit line layer as well as provided over the lower electrode layer in the peripheral region to form an upper electrode of the gate.

Preferably, method further comprises depositing a metal barrier layer on the cell region and the peripheral region, wherein the first conductive layer is formed over the metal barrier layer.

Preferably, heights of the bit line layer and upper electrode of the gate are substantially the same Preferably, the forming an insulation layer in the cell region and a lower electrode layer of a gate in a peripheral region comprises depositing an insulation layer in the cell region and the peripheral region, removing the insulation layer deposited in the peripheral region while leaving at least part of the insulating layer in the cell region, depositing a second conductive layer over the cell region and the peripheral region, and removing the second conductive layer deposited over the cell region to expose the insulation layer provided over the cell region, wherein the second conductive layer remaining in the peripheral region is the lower electrode layer of the gate in the peripheral region.

Preferably, the removing the second conductive layer includes performing a chemical mechanical polishing (CMP) process on the second conductive layer to remove a height difference between the cell region and the peripheral region.

Preferably, the second conductive layer is removed using a dry etch process.

Preferably, the removing the insulation layer includes depositing a hard mask layer over the cell region and the peripheral region, patterning the hard mask layer to define the bit line contact hole, and etching the exposed insulation layer using the patterned hard mask layer.

Preferably, the method further comprises depositing a hard mask layer over the second conductive layer.

Preferably, the method further comprises patterning the bit line layer, the upper electrode layer, and the lower electrode layer to form a bit line at the cell region and a gate pattern at the peripheral region In accordance with another aspect of the present invention, a semiconductor memory device includes: a buried word line formed in an active region of a cell region; a bit line provided over the buried word line; an insulation layer configured to electrically isolate the active region from the bit line; and a gate pattern located in a peripheral region, the gate pattern having a lower electrode and an upper electrode, wherein a height of the insulation layer is substantially equal to that of the lower electrode of the gate pattern.

Preferably, a height of the bit line is substantially equal to that of the upper electrode of the gate pattern.

Preferably, the semiconductor memory device may further include a bit line contact plug electrically coupling the active region and the bit line.

Preferably, the semiconductor memory device may further include a metal barrier layer provided between the bit line contact plug and the insulation layer and between the upper electrode and the lower electrode of the gate pattern.

Preferably, the semiconductor memory device may further include: a storage node contact connected to the active region, wherein the bit line and the storage node contact are formed to be higher than the gate pattern.

Preferably, a channel region formed at a lower part of the buried word line in the cell region and has a three-dimensional structure in vertical and horizontal directions.

Preferably, a channel region associated with the gate pattern of the peripheral region has a planar shape.

BRIEF DESCRIPTION OF THE DRAWINGS

FIGS. 2a to 2o are cross-sectional views illustrating a semiconductor memory device and a method for manufacturing the same according to embodiments of the present invention.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 2A:
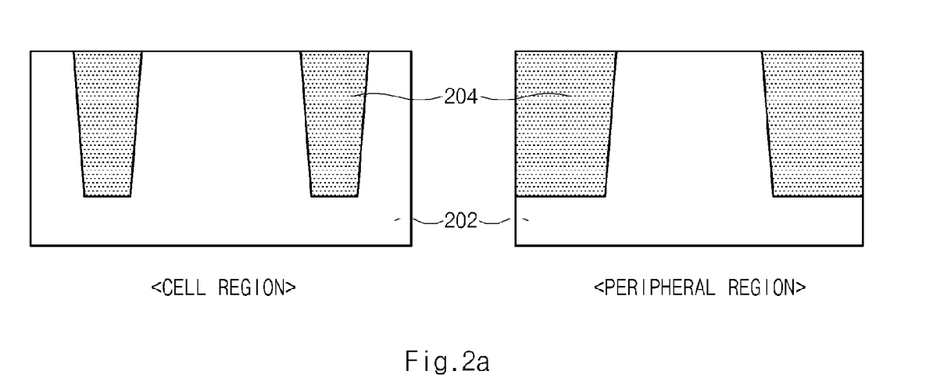

FIGS. 2a to 2o are cross-sectional views illustrating a semiconductor memory device and a method for manufacturing the same according to embodiments of the present invention.

Referring to FIG. 2a, through a shallow trench isolation insulating layer (STI) process, a device isolation layer (e.g., a STI layer) 204 for defining an active region 202 is formed in each of a cell region and peripheral region. The cell region is a region including a plurality of unit cells, and the peripheral region is a region including core and peripheral circuits (e.g., a power-supply circuit, a circuit for decoding commands and addresses, a local data line, and the like). Because a method for forming the device isolation layer 204 through the STI process is well known to those skilled in the art, a detailed description thereof will be omitted herein for convenience.

Figure 2B:
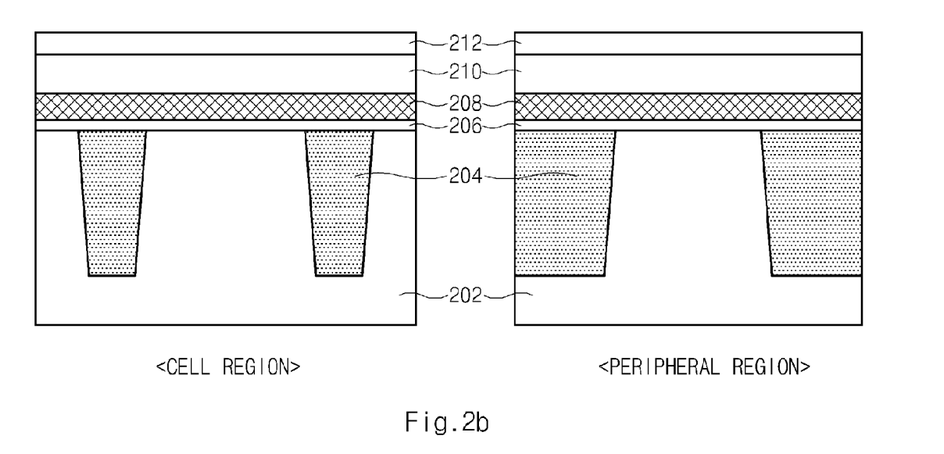

Referring to FIG. 2b, a pad oxide layer 206 and a pad nitride layer 208 are sequentially deposited on the active region 202 and the device isolation layer 204 in each of the cell region and the peripheral region. A first hard mask layer 210 is formed on the pad nitride layer 208, and an antireflective layer 212 is then deposited to pattern the hard mask layer 210. In this case, the first hard mask layer 210 may be formed of an amorphous carbon layer or the like. When forming a fine pattern, the antireflective layer 212 for preventing distortion of the fine pattern may be formed of a silicon oxide nitride (SiON) or the like. The above method for laminating several materials is one possible method for reducing the degree of distortion in a fine pattern of a higher-integration semiconductor memory device; however, it should be noted that different materials may be used or a given layer may be omitted in consideration of a process margin.

Figure 2C:
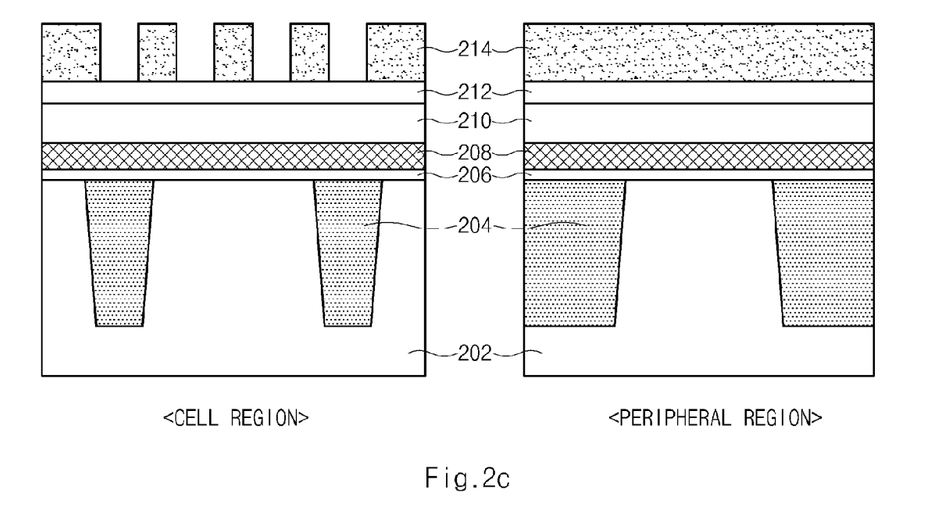

Referring to FIG. 2c, a first photoresist layer 214 is deposited on the antireflective layer 212, and a light-exposure process is carried out using a mask defining a word line so that the first photoresist layer 214 is etched.

Figure 2D:
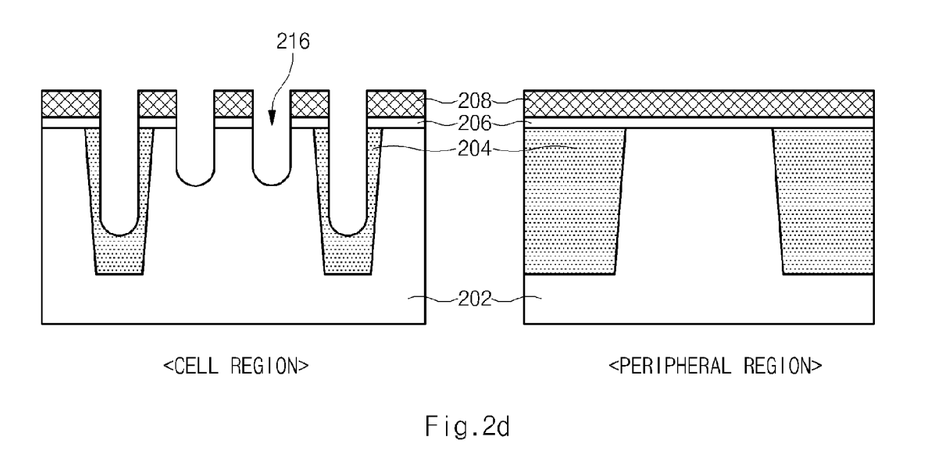

Referring to FIG. 2d, the exposed antireflective layer 212 and the first hard mask layer 210 are etched using the patterned first photoresist layer 214 as an etching mask, and the exposed pad nitride layer 208, the pad oxide layer 206, the active region 202, and the device isolation layer 204 are etched to form a recess 216. In this case, the peripheral region has no recess whereas the recess 216 is formed in the cell region.

Figure 2E:
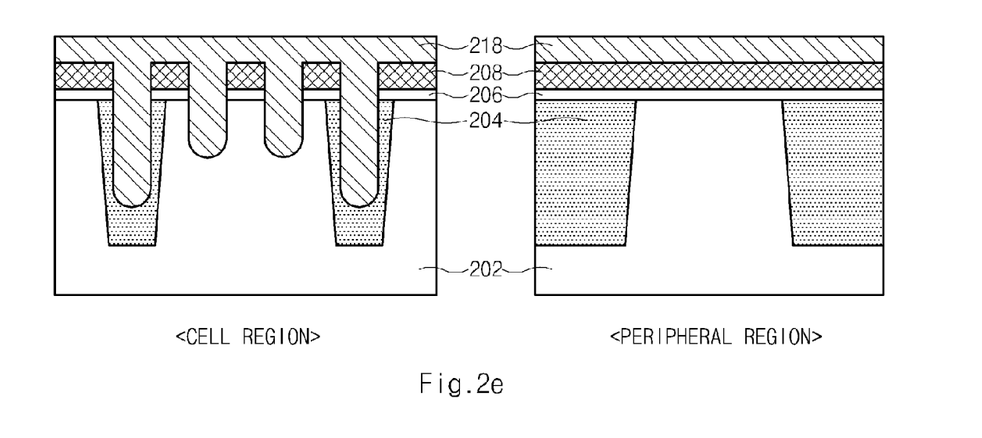

As shown in FIG. 2e, a first conductive layer 218 is deposited on the cell region and the peripheral region to fill the recess 216. In this case, a titanium-based metal or tungsten-based metal may be used as the first conductive layer 218 as a word line in the cell region. In one embodiment, the first conductive layer is made of polysilicon. The present embodiment uses metal as the first conductive layer due to its low resistance. In the present embodiment, considering a band gap between silicon and a gate electrode, a TiN material having an intermediate value is first deposited and then metal material having low resistance is deposited.

Figure 2F:
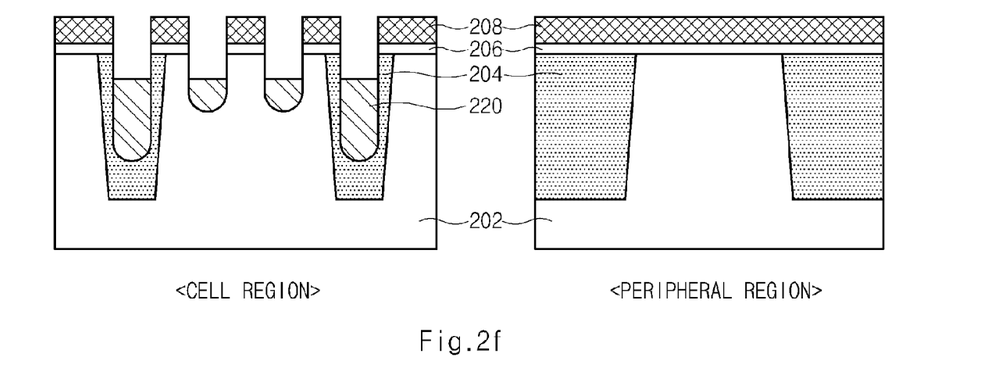

Referring to FIG. 2f, the first conductive layer 218 is planarized by a chemical mechanical polishing (CMP) process so that the first conductive layer 218 formed in the peripheral region is removed. An etch-back process is carried out in the first conductive layer 218 exposing a top portion of the recess 216 contained in the cell region. Through the above-mentioned etching process, the first conductive layer 218 is located below the upper surface of the active region 202 for formation of a buried word line 220. In this case, an upper part of the recess 216 is exposed substantially uniformly so that the same channel length and a uniform threshold voltage can be maintained between neighboring transistors. After etching the first conductive layer 218 from the upper part of the recess 216, the remaining pad nitride layer 208 is removed.

Figure 2G:
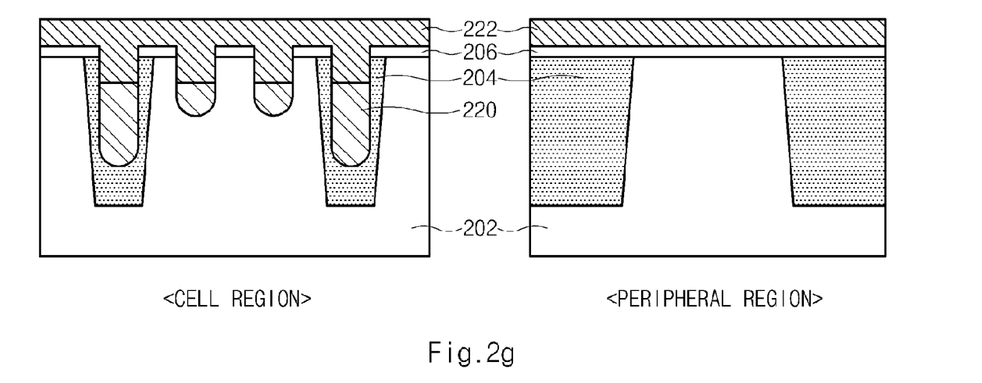

Referring to FIG. 2g, an insulation layer is deposited on a semiconductor substrate including the upper part of the recess 216. The insulation layer insulates the buried word lines and other constituent elements and also prevents the buried word line 220 from being oxidizing in a variety of oxygen-based post processes including an oxidation process. The insulation layer, for example, may be formed of a composite of a nitride layer 222 and a oxide layer 224. After depositing the nitride layer 222, the deposited nitride layer 222 is planarized to a predetermined thickness on the cell region and the peripheral region.

Figure 2H:
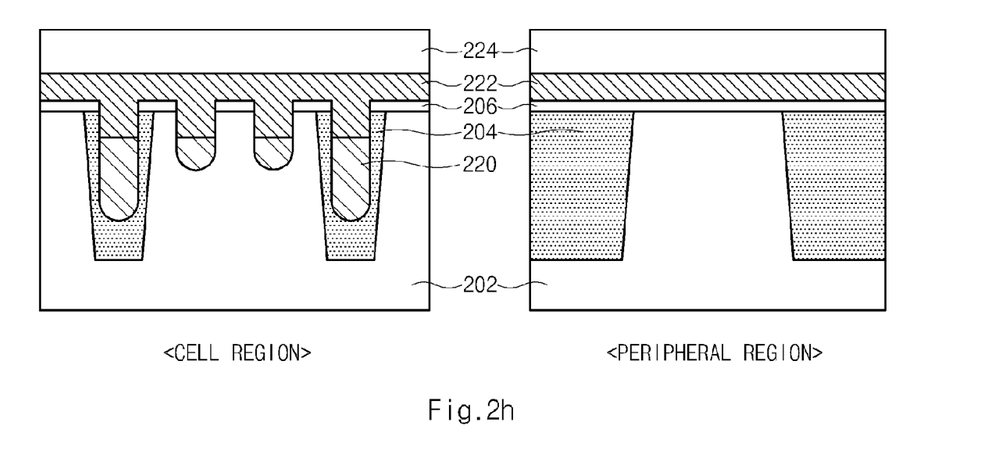

Referring to FIG. 2h, the oxide layer 224 is deposited on the nitride layer 222.

Figure 2I:
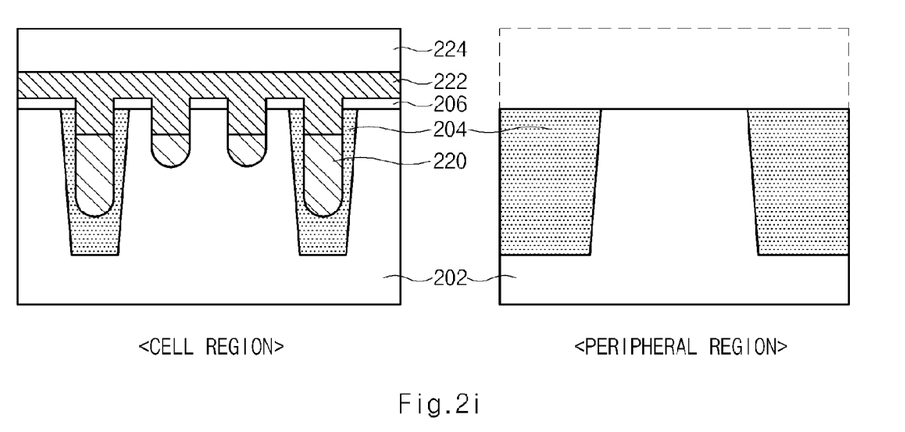

Referring to FIG. 2i, after the cell region is covered with a mask and exposing the peripheral region, the oxide layer 224 and the nitride layer 222 are removed from the peripheral region. This exposes the active region 202 in the peripheral region. In this case, the oxide layer 224 may be removed by a photolithography process, and the nitride layer 222 is selectively removed by a wet etching process including $H_3PO_4$ with minimal damage to an upper part of the active region 202.

Figure 2J:
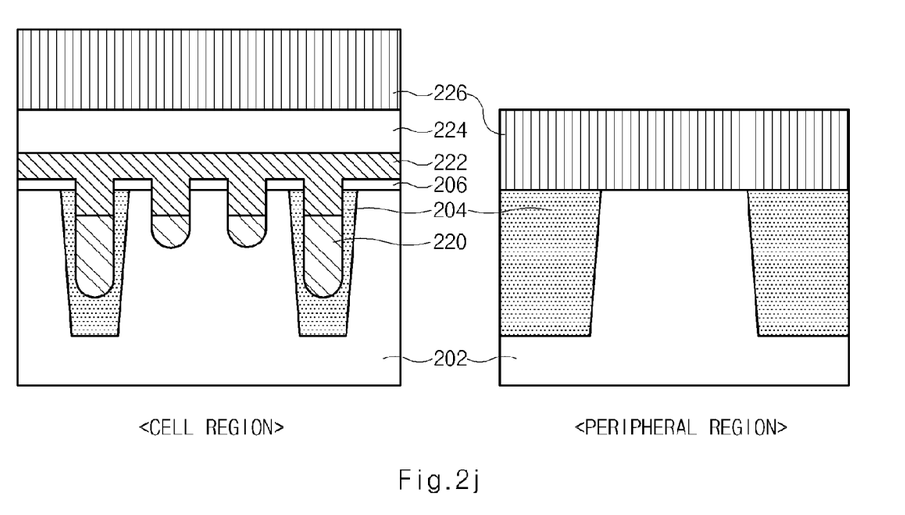

Referring to FIG. 2j, a polysilicon layer 226 is formed of a material for a lower gate electrode. In this case, due to the nitride layer 222 and the oxide layer 224 that remain only in the cell region, there is a difference in height between the polysilicon layer 226 formed in the cell region and the polysilicon layer 226 formed in the peripheral region.

Figure 2K:
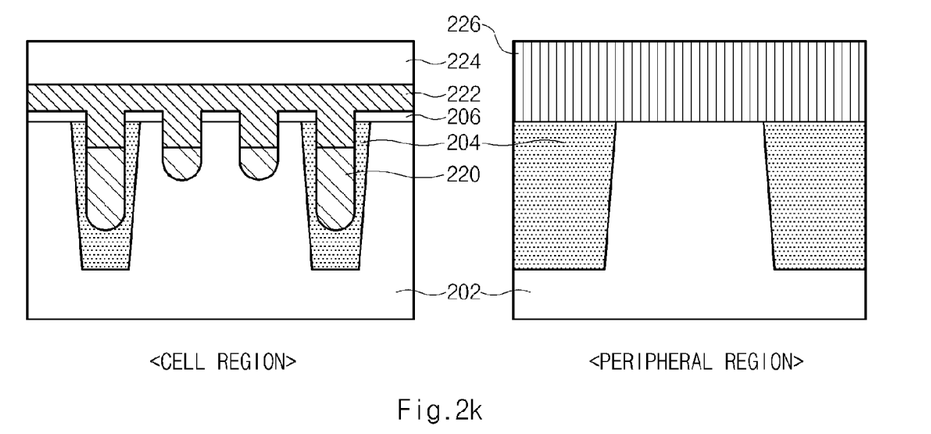

Referring to FIG. 2k, the polysilicon layer 226 deposited on the cell region is removed. In order to remove this polysilicon layer 226 as shown in FIG. 2k, a method for removing the polysilicon layer 226 using the photolithography process based on a mask exposing the cell region may be used, or a chemical mechanical polishing (CMP) process for removing the height difference between the cell region and the peripheral region may also be used. In this case, the polysilicon layer 226 deposited on the cell region is removed while the polysilicon layer 226 deposited on the peripheral region maintains a uniform thickness.

The polysilicon layer 226 formed at the peripheral region is used as a lower electrode for constructing a gate pattern at a later time; however, it is difficult to adjust the density of N-type or P-type impurities. Therefore, the process for removing the polysilicon layer 226 deposited in the cell region using the photolithography process may be more preferable than the CMP process which has difficulty in predicting the thickness of the polysilicon layer 226.

Figure 2L:
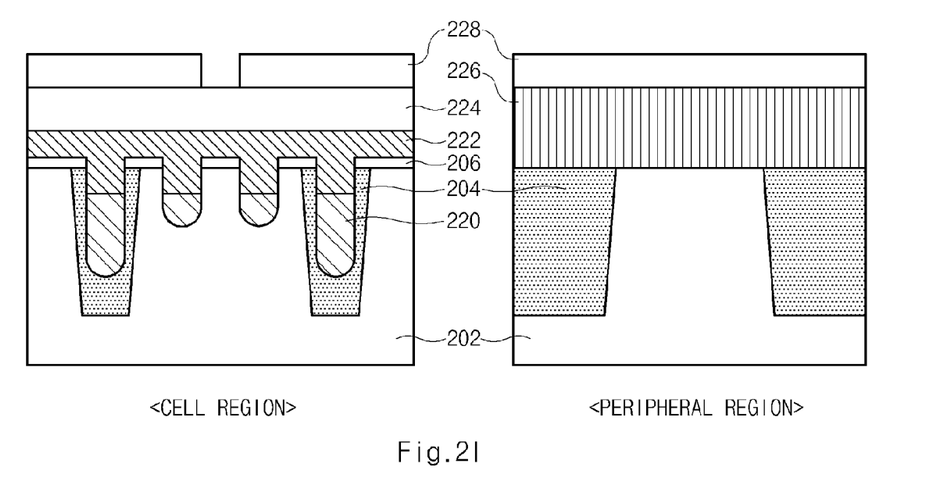

Referring to FIG. 2l, a second hard mask layer 228 is formed on the oxide layer 224 of the cell region and on the polysilicon layer 226 of the peripheral region. Thereafter, the second hard mask layer 228 is patterned by the photolithography process based on a mask defining a bit line contact plug to be formed in the cell region.

Figure 2M:
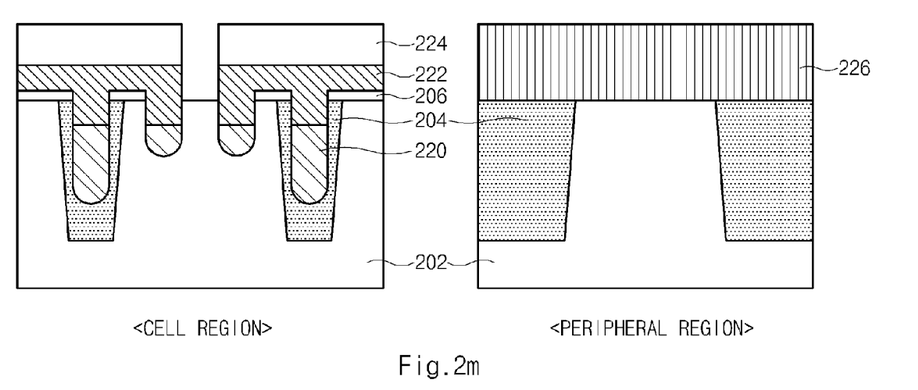

Referring to FIG. 2m, the oxide layer 224 and the nitride layer 222 exposed in the cell region are etched using the patterned second hard mask layer 228 as an etching mask, so that an upper part of the active region 202 located between buried word lines 220 is exposed. Thereafter, the remaining hard mask layer 228 is removed. In this case, the second hard mask layer 228 formed at the peripheral region is completely removed so that an upper part of the polysilicon layer 226 is exposed.

Figure 2N:
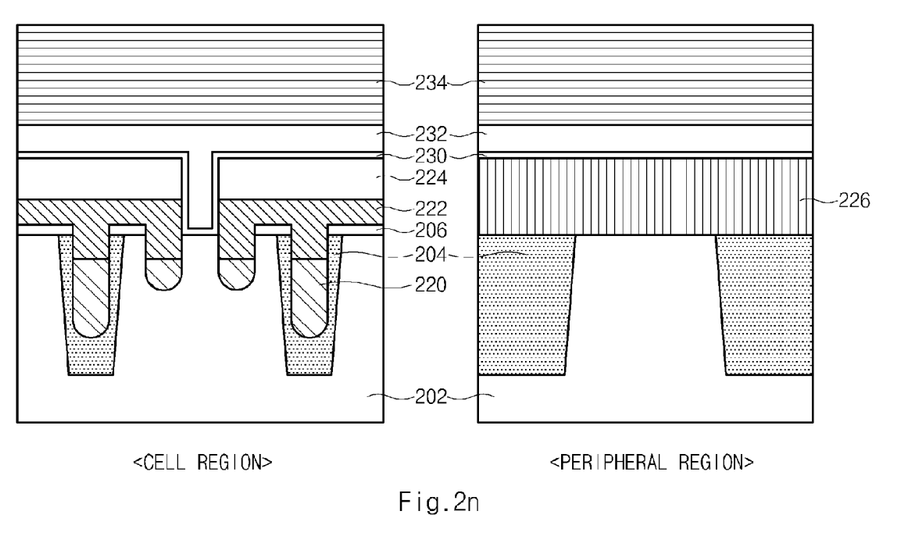

Referring to FIG. 2n, a metal barrier layer 230 is deposited on the cell region and the peripheral region, and a metal layer 232 is deposited on the metal barrier layer 230. In a subsequent thermal process, a silicide is formed at an interface between the metal barrier layer 230 and an active region 202 so that the metal barrier layer 230 can improve contact resistance. In this case, the metal barrier layer 230 may be formed of a metal material, for example, TiN, TaN, WN or the like.

The metal layer 232 may apply a tungsten-based or titanium-based metal (e.g., W, WSix, or TiSix) having a low resistance as an upper electrode of a gate pattern formed at the peripheral region, so that the upper electrode of the gate pattern may be formed of the tungsten-based or titanium-based metal. A hard mask layer 234, e.g., nitride layer, is deposited on the metal layer 232.

Referring to FIG. 2o, a bit line is defined in the cell region. One cell-region cross-sectional view illustrated in one part (i) of FIG. 2o and another cell-region cross-sectional view illustrated in another part (ii) of FIG. 2o are obtained from the same cell region taken along cut-lines which are 90 degrees apart. A hard mask nitride layer 234, a metal layer 232, a metal barrier layer 230, an oxide layer 224, a nitride layer 222, and a polysilicon layer 226 are etched using a mask defining a gate pattern. Through the above-mentioned etching process, a bit line contact plug 244 and a bit line 246, composed of a metal layer 232, is formed in the cell region; and a gate pattern 238, composed of a polysilicon layer 226, a metal barrier layer 230, and a metal layer 232, is formed in the peripheral region.

Figure 3:
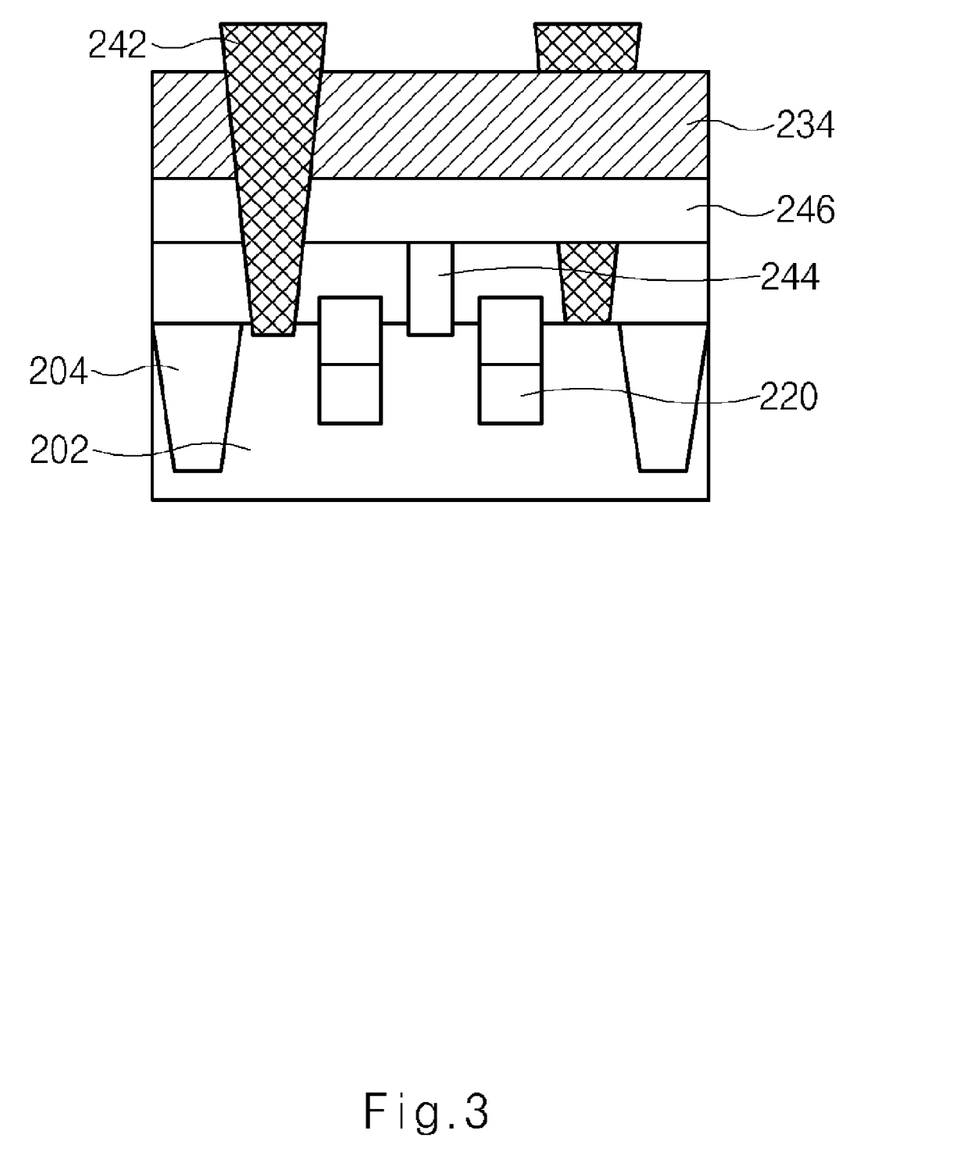
FIG. 3 is a conceptual diagram illustrating a cell region of a semiconductor memory device formed by the semiconductor manufacturing method of FIGS. 2a to 2o.

FIG. 3 is a conceptual diagram illustrating the cell region of a semiconductor memory device formed by the semiconductor manufacturing method of FIGS. 2a to 2o.

Referring to FIG. 3, the semiconductor memory device includes a buried word line 220 contained in the active region 202, a bit line 246 connected to the active region 202, and a storage node contact 242 for connecting a capacitor (not shown) to the active region 202 in the cell region. Referring to FIG. 2o, the semiconductor memory device also includes a gate pattern 238 composed of upper and lower electrodes in the peripheral region. The bit line 246 is formed to have the same height as that of the upper electrode of the gate pattern 238, and the bit line contact plug 244 is formed to have the same height as that of the lower electrode of the gate pattern 238.

Compared with the bit line contact plug 164 of FIG. 1b, the bit line contact plug 244 in the cell region of the semiconductor memory device can reduce a contact resistance because a height of the bit line contact plug 244 is lower than that of the bit line contact plug 164. Further, the bit line contact plug 244 in the cell region of the semiconductor memory device can has a smaller parasitic capacitance than the bit line contact plug 194 of FIG. 1c, because a distance between the bit line contact plug 244 and the buried word line 220 is longer than that between the bit line contact plug 194 and the gate pattern 180 of FIG. 1c, as well as a physical distance between the bit line contact plug 244 and the storage node contact 242 becomes longer unlike the conventional semiconductor memory device of FIG. 1c, that is, a neighboring region between the bit line contact plug 244 and the storage node contact 242 is absent. As a result, the sense amplifier easily detects data so that an operational margin increases.

In addition, the bit line contact plug 244 and the bit line 246 are formed of the same metal material in the present invention, whereas the bit line contact plug 194 of the conventional semiconductor memory device is formed of a polysilicon layer and is used as a constituent material of a lower electrode of the gate pattern formed in the peripheral region.

Moreover, the above-mentioned method for manufacturing the semiconductor memory device according to the present invention does not need to etch a thick insulation layer as in the process for forming the bit line contact plug 164 of FIG. 1b, so that a process margin for forming the bit line contact plug 244 increases. In other words, when a gate pattern including a plurality of electrodes is formed in a peripheral region, the present invention guarantees a region where a bit line contact plug will be formed after a lower electrode is formed, and then simultaneously forms an upper electrode, a bit line contact plug, and a bit line, thereby increasing a process margin for forming the bit line contact plug.

As apparent from the above description, various embodiments of the present invention configure a word line, contained in a cell array of a high-integration semiconductor memory device, in the form of a buried structure, so as to reduce parasitic capacitance between the word line and other constituent elements (e.g., a bit line), thereby increasing an operational margin for allowing the sense amplifier to easily detect data transferred through the bit line.

In addition, the semiconductor memory device according to the present invention forms the bit line and the bit line contact plug in the cell region using metal used to form an upper electrode of the gate pattern formed in the peripheral region, so that a physical distance between the bit line and the storage node contact in the cell region is increased, resulting in a reduction in parasitic capacitance.

Moreover, the semiconductor memory device according to embodiments of the present invention includes a buried gate structure in the cell region, and guarantees a process margin for forming a storage node contact and a bit line contact plug, thereby reducing parasitic capacitance generated in the entirety of the bit line.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor memory device, comprising:
    forming a buried word line in an active region of a cell region;
    forming an insulation layer in the cell region and a lower electrode layer of a gate in a peripheral region so that a height of the insulation layer is substantially equal to that of the lower electrode layer; and
    providing a first conductive layer over the cell region and the peripheral region to form a bit line layer and an upper electrode layer, respectively.

2. The method according to claim 1, further comprising:
    etching the insulation layer to form a bit line contact hole in the active region of the cell region, the bit line contact hole exposing the active region adjacent to the buried word line; and
    filling the bit line contact hole to form a bit line contact plug.

3. The method according to claim 2, wherein the first conductive layer is formed by extending outside of the bit line contact hole to define the bit line layer as well as provided over the lower electrode layer in the peripheral region to form an upper electrode of the gate.

4. The method according to claim 2, further comprising:
    depositing a metal barrier layer on the cell region and the peripheral region, wherein the first conductive layer is formed over the metal barrier layer.

5. The method according to claim 1, wherein heights of the bit line layer and upper electrode of the gate are substantially the same.

6. The method according to claim 1, wherein the forming an insulation layer in the cell region and a lower electrode layer of a gate in a peripheral region comprises:
    depositing an insulation layer in the cell region and the peripheral region;
    removing the insulation layer deposited in the peripheral region while leaving at least part of the insulating layer in the cell region;
    depositing a second conductive layer over the cell region and the peripheral region; and
    removing the second conductive layer deposited over the cell region to expose the insulation layer provided over the cell region, wherein the second conductive layer remaining in the peripheral region is the lower electrode layer of the gate in the peripheral region.

7. The method according to claim 6, wherein the removing the second conductive layer includes:
    performing a chemical mechanical polishing (CMP) process on the second conductive layer to remove a height difference between the cell region and the peripheral region.

8. The method according to claim 6, wherein the second conductive layer is removed using a dry etch process.

9. The method according to claim 6, wherein the removing the insulation layer in the peripheral region includes:
    depositing a hard mask layer over the cell region and the peripheral region;
    patterning the hard mask layer to expose the insulation layer of the peripheral region; and
    etching the exposed insulation layer in the peripheral region using the patterned hard mask layer.

10. The method according to claim 6, further comprising:
    depositing a hard mask layer over the second conductive layer.

11. The method according to claim 1, further comprising:
    patterning the bit line layer, the upper electrode layer, and the lower electrode layer to form a bit line at the cell region and a gate pattern at the peripheral region.

12. The method according to claim 1, wherein a height of the bit line layer is substantially equal to that of the upper electrode layer.

13. A semiconductor memory device comprising:
    a buried word line formed in an active region of a cell region;
    a bit line provided over the buried word line;
    an insulation layer configured to electrically isolate the active region from the bit line; and
    a gate pattern located in a peripheral region, the gate pattern having a lower electrode and an upper electrode,
    wherein a height of the insulation layer is substantially equal to that of the lower electrode of the gate pattern.

14. The semiconductor memory device according to claim 13, wherein a height of the bit line is substantially equal to that of the upper electrode of the gate pattern.

15. The semiconductor memory device according to claim 13, further comprising:
    a bit line contact plug electrically coupling the active region and the bit line.

16. The semiconductor memory device according to claim 15, further comprising:
    a metal barrier layer provided between the bit line contact plug and the insulation layer and between the upper electrode and the lower electrode of the gate pattern.

17. The semiconductor memory device according to claim 13, further comprising:
a storage node contact connected to the active region, wherein the bit line and the storage node contact are formed to be higher than the gate pattern.

18. The semiconductor memory device according to claim 13, wherein a channel region formed at a lower part of the buried word line in the cell region and has a three-dimensional structure in vertical and horizontal directions.

19. The semiconductor memory device according to claim 13, wherein a channel region associated with the gate pattern of the peripheral region has a planar shape.

* * * * *